United States Patent
Iguchi

(10) Patent No.: US 7,299,434 B2
(45) Date of Patent: Nov. 20, 2007

(54) SLACK VALUE SETTING METHOD, SLACK VALUE SETTING DEVICE, AND RECORDING MEDIUM RECORDING A COMPUTER-READABLE SLACK VALUE SETTING PROGRAM

(75) Inventor: Katsumi Iguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 395 days.

(21) Appl. No.: 10/967,356

(22) Filed: Oct. 19, 2004

(65) Prior Publication Data

US 2005/0283748 A1    Dec. 22, 2005

(30) Foreign Application Priority Data

Jun. 18, 2004    (JP) .............................. 2004-180679

(51) Int. Cl.
*G06F 17/50* (2006.01)

(52) U.S. Cl. .............................................. 716/6; 716/5

(58) Field of Classification Search ................. 716/4–6
See application file for complete search history.

(56) References Cited

U.S. PATENT DOCUMENTS 5,636,372 A * 6/1997 Hathaway et al. .......... 713/500
5,946,475 A * 8/1999 Burks et al. ................... 716/6
6,678,870 B2   1/2004 Okada et al. .................. 716/6
6,795,951 B2 * 9/2004 Hathaway et al. ............. 716/5
7,117,466 B2 * 10/2006 Kalafala et al. ............... 716/6
2005/0198601 A1 * 9/2005 Kuang et al. .................. 716/6

FOREIGN PATENT DOCUMENTS

| JP | 10-301962 | 11/1998 |
| JP | 11-110421 | 4/1999 |
| JP | 2003-6257 | 1/2003 |
| JP | 2003-91567 | 3/2003 |
| JP | 2003-162561 | 6/2003 |

* cited by examiner

*Primary Examiner*—Vuthe Siek
(74) *Attorney, Agent, or Firm*—Staas & Halsey LLP

(57) ABSTRACT

A slack value setting device comprises a worst path selecting section, a first slack value calculating section for calculating slack value set up to each of the transit pins on the worst path, a first slack value setting section for setting up the slack value to each of the transit pins on the worst paths, a worst path branching pin table generating section, a second slack value calculating section for calculating the slack value set up to each of the transit pins on the another paths, a second slack value setting section for setting up the slack value to each of the transit pins on the another paths due to back trace on the another paths from a branching pin stored in the worst path branching pin table; resulting in high speed setting of the slack value on the data paths.

10 Claims, 16 Drawing Sheets

FIG. 14

| Order | Branch Pins | |
|---|---|---|
| #1 | [1]  [2] | SLACK PASS-ON PROCESSING ON 1, 2 (UP TO LAST PIN CK) |
| #2 | [3]  [4] | SLACK PASS-ON PROCESSING ON 3, 4 |
| #3 | [5]  [6]  [7] | SLACK PASS-ON PROCESSING ON 5, 6, 7 |
| #4 | [8]  [9] | SLACK PASS-ON PROCESSING ON 8, 9 |
| #5 | [10] | SLACK PASS-ON PROCESSING ON 10 |

FIG. 17

PRIOR ART

```
SLACK VALUE OBTAINED FROM Tcalc3 IS PASSED ON TO PINS ON WORST PATH.
SLACK VALUE IS SET TO [1], [2] AS INITIAL VALUE.

loop {
    found_branch = false;
    foreach p of ( ALL BRANCHING PINS      [1],[2], .... , [10] )
        if (HAS SLACK VALUE SET UP TO P?) {
            NEW SLACK VALUE IS GENERATED FROM SLACK VALUE OF P AND DELAY OF P.
            NEW SLACK VALUE IS PASSED ON UNTIL LAST PIN OF THE SUPERIOR STEP
            IS FOUND FROM THE NEXT STEP OF P.
            found_branch = true;

}
    }
    if ( not found_branch ) break;
}
```

SLACK VALUE SETTING METHOD, SLACK VALUE SETTING DEVICE, AND RECORDING MEDIUM RECORDING A COMPUTER-READABLE SLACK VALUE SETTING PROGRAM

BACKGROUND OF THE INVENTION (1) Field of the Invention

The present invention relates to a setting technique of reference value (slack value) for determining delay in data path, which is suitably used for timing check for estimating whether or not an electronic circuit operates normally.

(2) Description of Related Art

Generally, in designing process of electronic circuit, in order to determine whether or not the circuit operates normally, timing check for determining whether or not the delay between FF (Flip-Flop) for transmitting data falls within the setup/hold restriction conditions (over delay, racing) is carried out (for example, refer to patent document 1 below).

In electronic circuits, when a plurality of branch paths are formed by providing branching pins on a data path, there are cases where extra delay is afforded or no delay is afforded depending on the branch path. Designers determine whether or not the related branch path should be corrected depending on the extra/no delay in the branch path. In order to detect the degree of the extra delay, slack value is used.

The slack value is a difference between the maximum delay, which is possibly generated up to a device on a data path and an arriving time (allowable arriving time), which is allowed to the device. The slack value indicates the margin of timing in the device. The slack value is set up to the pins on the data paths. It is arranged so that, when a data path is branched, a delay difference between a worst delay and the slack value is passed on (set up) to each of the transit pins on the branch path as the slack value. In conventional calculating technique of slack value, before passing on the slack value, it is necessary to obtain a slack value before branching and to detect unprocessed branching pins.

In accordance with the flowchart (steps S10-S250) shown in FIG. 16, a conventional setting technique of the slack value is described.

First of all, a forward trace is carried out from the feeding side FF toward the receiving side FF (step S10); thereby, every path route between the feeding side FF and the receiving side FF is recognized, and gate delays in the gates (occasionally referred to as cell or element), which are disposed on these path routes, are acquired. The gate delays are stored in a database (for example, a table in the memory). Based on the gate delays, a worst path, which has the largest path delay, is selected from all of the path routes between the feeding side FF and the receiving side FF.

Every branching pin (branched pin) in all path routes is detected and registered (stored) in a table T. The table T is used for registering every branching pins on an electronic circuit as the objects to be evaluated connecting to predetermined flags. Various kinds of flags in the table T are all initialized (step S20).

The initial slack value s0 is calculated (step S30), and with respect to the worst path, the backward trace starts from the receiving side FF toward the feeding side FF (step S40). Hereinafter, in the figure, the backward trace will be referred to as back trace.

With respect to the worst path, after checking whether or not the backward trace has completed (step S50). When the backward trace has not been completed (refer to NO route in step S50), an initial slack value s0, which is calculated in step S30 is set up (step S60) to the transit pin x.

It is determined whether or not the transit pin x has been registered in the table T (step S70). When the transit pin X is registered in the table T (refer to YES route in step S70), assuming that the table of the transit pin x is t1, "on" is set to the flags set up with slack value in t1 (step S80), and the next transit pin is set to x (step S90). When the transit pin x has not been set up in the table T, (refer to NO route in step S70), the process proceeds to step S90. In the table t1, it is arranged so that flags set up with slack value and flags of selected branch path are stored being connected to each other.

When the backward trace has completed (refer to YES route in step S50), the branch path processing flag B is set up with "off" (step S100), the first element in the table T is set to t1 (step S110). The branch path processing flag B is a flag for determining whether or not every process has completed.

It is determined whether or not that the t1 is the last element in the table T (step S120). When the t1 is not the last element, (refer to NO route in step S120), it is checked whether the flag of selected branch path of the t1 is "off" (step S130). Here, when the flag of selected branch path of the t1 is "off" (refer to YES route in step S130), then, it is checked whether the flag of the t1, which has been set up with slack value, is "on" (step S140). When the flag of the t1, which has been set up with slack value, is "on" (refer to YES route in step S140), after calculating a new slack value s1 (step S150), using the branching pin of the t1 as the start pin, a backward trace on the path route relevant to the branching pin starts (step S160).

It is checked whether or not the backward trace on the path route relevant to branching pin has completed (step S170). When the backward trace has not completed (refer to NO route in step S170), slack value s1 calculated in step S150 is set up to the transit pin x (step S180).

It is determined whether or not the transit pin x has been registered in the table T (step S190). When the transit pin x has been registered in the table T (refer to YES route in step S190), the table of the transit pin x is set to t2, the flag of t2, which has been set up with slack value, is set to "on" (step S200), the next transit pin is set to x (step S210), and the process returns to step S170. When the transit pin x has not been set up in the table T (refer to NO route in step S190), the process proceeds to step S210.

When the backward trace has completed (refer to YES route in step S170), the flag of selected branch path of the t1 is set with "on" (step S230), the branch path processing flag B is set with "on" (step S240). The next element in the table T is set to t1 (step S250), the process returns to step S120.

On the other hand, when the flag of selected branch path of the t1 is not "off" (refer to NO route in step S130), or when the flag of t1, which has been set up with slack value, is "on" (refer to NO route in step S140), the process proceeds to step S250.

Also, when the element is the last element in the table T (refer to YES route in step S120), it is checked whether or not the branch path processing flag B is "off" (step S220). When the branch path processing flag B is "off", (refer to YES route in step S220), the process is terminated. When the branch path processing flag B is not "off" (refer to NO route in step S220), the process returns to step S100.

By carrying out the above-described processing (steps S10-S250), the slack values can be set up to the pins on the data paths.

[Patent document 1] Japanese Patent Laid-open No. 11-110421

However, in the conventional calculating technique of slack value, it is necessary to detect branching pins of which superior path has been processed and pass on slack value thereto, and the processing has to be looped until no unprocessed branching pin is detected (refer to step S220 etc in FIG. 16).

FIG. 17 is a diagram showing an example of a program for carrying out the conventional slack value setting technique. For example, in an electronic circuit, which has ten branching pins [1]-[10], the generation of the slack values and pass-on thereof are repeatedly carried out (looped) until every transit pin on the branch paths relevant to these branching pins is set up with slack value.

In the conventional slack value setting technique as described above, for example, when n of branching pins (n is natural number) are included, it is necessary to search unprocessed branching pins, at the maximum, n, n−1, n−2, . . . , 2, 1 times. This means that the loop processing has to be carried out repeatedly, at the maximum, the times expressed by the following formula:

$$\sum_{k=1}^{n} n = n(n+1)/2 \qquad \text{[Formula 1]}$$

That is, at the maximum, nearly $n^2$ times of the loop processing become a necessity. It takes extremely long time for such loop processing. Accordingly, there resides such problem that it takes a long time to set up slack values. Particularly, when the size of the circuit is large and complicated, and the number of the branch paths is increased, a large influence is rendered to the processing time for timing check.

SUMMARY OF THE INVENTION

Accordingly, the present invention has been proposed in view of the above-described problem. An object of the present invention is to increase the setting speed of slack values to the gates on data paths to a high speed.

Accordingly, a slack value setting method of the present invention is a slack value setting method for setting a slack value to each of the transit pins of plural gates on data paths with respect to an electronic circuit having plural data paths between a start point and an end point, the slack value setting method comprising a worst path selecting step for selecting a worst path having the largest path delay in the plural data paths, a first slack value calculating step for calculating the slack value to be set up to each of the transit pins on the worst path, a first slack value setting step for setting up the slack value calculated in the first slack value calculating step to each of the transit pins on the worst path, a worst path branching pin table generating step for generating a worst path branching pin table registered with the branching pins in a predetermined order by carrying out a backward trace from the end point toward the start point of the worst path to pick out the branching pins in the backward direction of the worst path, a second slack value calculating step for calculating the slack value to be set up to each of the transit pins on another paths other than the worst path in the plural data paths, and a second slack value setting step for setting up the slack value calculated in the second slack value calculating step to each of the transit pins on the another paths by carrying out backward trace on the another paths from the branching pins stored in the relevant worst path branching pin table based on the worst path branching pin table generated in the worst path branching pin table generating step.

The slack value setting method may further comprise a slack value setting determination step for determining whether or not the slack value has been set up with respect to the transit pins on the data paths, wherein in the slack value setting determination step, the second slack value calculating step and the second slack value setting step may be repeatedly carried out until it is determined that the slack value has been set up to all of the transit pins on the data paths.

Also, the slack value setting method may further comprise an another path branching pin table generating step for generating an another path branching pin table registered with the branching pins in a predetermined order by carrying out backward trace on the another paths from the branching pin to pick out the branching pins in the backward direction of the another paths, a third slack value calculating step for calculating the slack value to be set up to each of the transit pins on the another paths, and a third slack value setting step for setting the slack value calculated in the third slack value calculating step to each of the transit pins on the another paths by carrying out backward trace on the another paths from the branching pin stored in the another path branching pin table based on the another path branching pin table generated in the another path branching pin table generating step, wherein the another path branching pin table generating step, the third slack value calculation step and the third slack value setting step are repeatedly carried out until it is determined that the slack value has been set up to all of the transit pins on the data paths in the slack value setting determination step.

Further, the slack value setting method of the present invention is a slack value setting method for setting a slack value to each of the transit pins of plural gates on data paths with respect to an electronic circuit having plural data paths between a start point and an end point, the slack value setting method comprising a slack value calculation step for calculating the slack value to be set up to each of the transit pins on the data paths, a branching pin table generating step for generating a branching pin table registered with the branching pins in a predetermined order by carrying out backward trace from the end point to the start point of the data path to pick out branching pins in the backward direction of the data path, a slack value setting step for setting the slack value calculated in the slack value calculation step to each of the transit pins on the data paths by carrying out backward trace on the data path from the branching pins stored in the branching pin table based on the branching pin table generated in the branching pin table generating step, and a slack value setting determination step for determining whether or not the slack value has been set up with respect to the branching pins on the data path, wherein the slack value calculation step, the branching pin table generating step and the slack value setting step are repeatedly carried out until it is determined that the slack value has set up to all of the branching pins on the data paths in the slack value setting determination step.

A slack value setting device of the present invention is a slack value setting device for setting a slack value to each of the transit pins of plural gates on data paths with respect to an electronic circuit having plural data paths between a start point and an end point, the slack value setting method comprising: a worst path selecting section for selecting a worst path having the largest path delay in the plural data paths, a first slack value calculating section for calculating the slack value to be set up to each of the transit pins on the worst path, a first slack value setting section for setting up the slack value calculated in the first slack value calculating section to each of the transit pins on the worst path, a worst path branching pin table generating section for generating a worst path branching pin table registered with the branching pins in a predetermined order by carrying out a backward trace from the end point toward the start point of the worst path to pick out the branching pins in the backward direction of the worst path, a second slack value calculating section for calculating the slack value to be set up to each of the transit pins on another paths other than the worst path in the plural data paths, and a second slack value setting section for setting up the slack value calculated in the second slack value calculating section to each of the transit pins on the another paths by carrying out backward trace on the another paths from the branching pins stored in the worst path branching pin table based on the worst path branching pin table generated in the worst path branching pin table generating section.

The slack value setting device further may comprises a slack value setting determination section for determining whether or not the slack value has been set up with respect to the transit pins on the data paths, wherein the second slack value calculating section and the second slack value setting section may repeatedly carry out the calculation of the slack value and the setting of the slack value respectively until it is determined that the slack value has been set up to all of the transit pins on the data paths by the slack value setting determination section.

Also, the slack value setting device may further comprises an another path branching pin table generating section for generating an another path branching pin table registered with the branching pins in a predetermined order by carrying out backward trace on the another paths from the branching pin to pick out the branching pins in the backward direction of the another paths, a third slack value calculating section for calculating the slack value to be set up to each of the transit pins on the another paths, and a third slack value setting section for setting the slack value calculated in the third slack value calculating section to each of the transit pins on the another paths by carrying out backward trace on the another paths from the branching pin stored in the another path branching pin table based on the another path branching pin table generated in the another path branching pin table generating section, wherein the another path branching pin table generating section, the third slack value calculating section and the third slack value setting section repeatedly may carry out the generation of the another path branching pin table, the calculation of the slack value and the setting of the slack value until it is determined that the slack value has been set up to all of the transit pins on the data paths by the slack value setting determination section.

A recording medium recording therein a slack value setting program readable by a computer of the present invention, which causes the computer to execute slack value setting function to set up slack values to transit pins of plural gates on the data path with respect to an electronic circuit having plural data paths between a start point and an end point, wherein the slack value setting program causes the computer to execute a worst path selecting step for selecting a worst path having the largest path delay in the plural data paths; a first slack value calculating step for calculating the slack value to be set up to each of the transit pins on the worst path; a first slack value setting step for setting up the slack value calculated in the first slack value calculating step to each of the transit pins on the worst path; a worst path branching pin table generating step for generating a worst path branching pin table registered with the branching pins in a predetermined order by carrying out a backward trace from the end point toward the start point of the worst path to pick out the branching pins in the backward direction of the worst path; a second slack value calculating step for calculating the slack value to be set up to each of the transit pins on another paths other than the worst path in the plural data paths; and a second slack value setting step for setting up the slack value calculated in the second slack value calculating step to each of the transit pins on the another paths by carrying out backward trace on the another paths from the branching pins stored in the worst path branching pin table based on the worst path branching pin table generated in the worst path branching pin table generating step.

The slack value setting program may cause the computer to execute a slack value setting determination step for determining whether or not the slack value has been set up with respect to the transit pins on the data paths, and further may cause the computer to repeatedly execute the second slack value calculation step and the second slack value setting step until it is determined that the slack value has been set up to all of the transit pins on the data paths in the slack value setting determination step.

The slack value setting program may cause the computer to execute an another path branching pin table generating step for generating an another path branching pin table registered with the branching pins in a predetermined order by carrying out backward trace on the another paths from the branching pin to pick out the branching pins in the backward direction of the another paths; a third slack value calculating step for calculating the slack value to be set up to each of the transit pins on the another paths; and a third slack value setting step for setting the slack value calculated in the third slack value calculating step to each of the transit pins on the another paths by carrying out backward trace on the another paths from the branching pin stored in the another path branching pin table based on the another path branching pin table generated in the another path branching pin table generating step, and further may cause the computer to execute the another path branching pin table generating step, the third slack value calculation step and the third slack value setting step repeatedly until it is determined that the slack value has been set up to all of the transit pins on the data paths in the slack value setting determination step.

According to the present invention, an advantage that slack values are set up to the gates on the data paths at a high speed is obtained.

BRIEF DESCRIPTION OF THE DRAWINGS

FIG. 14 is a diagram for illustrating process when the slack value is set up in an electronic circuit using the slack value setting device as one embodiment of the present invention;

FIG. 17 is a diagram showing an example of a program for achieving the conventional slack value setting technique.

DESCRIPTION OF THE PREFERRED EMBODIMENTS

Figure 1:
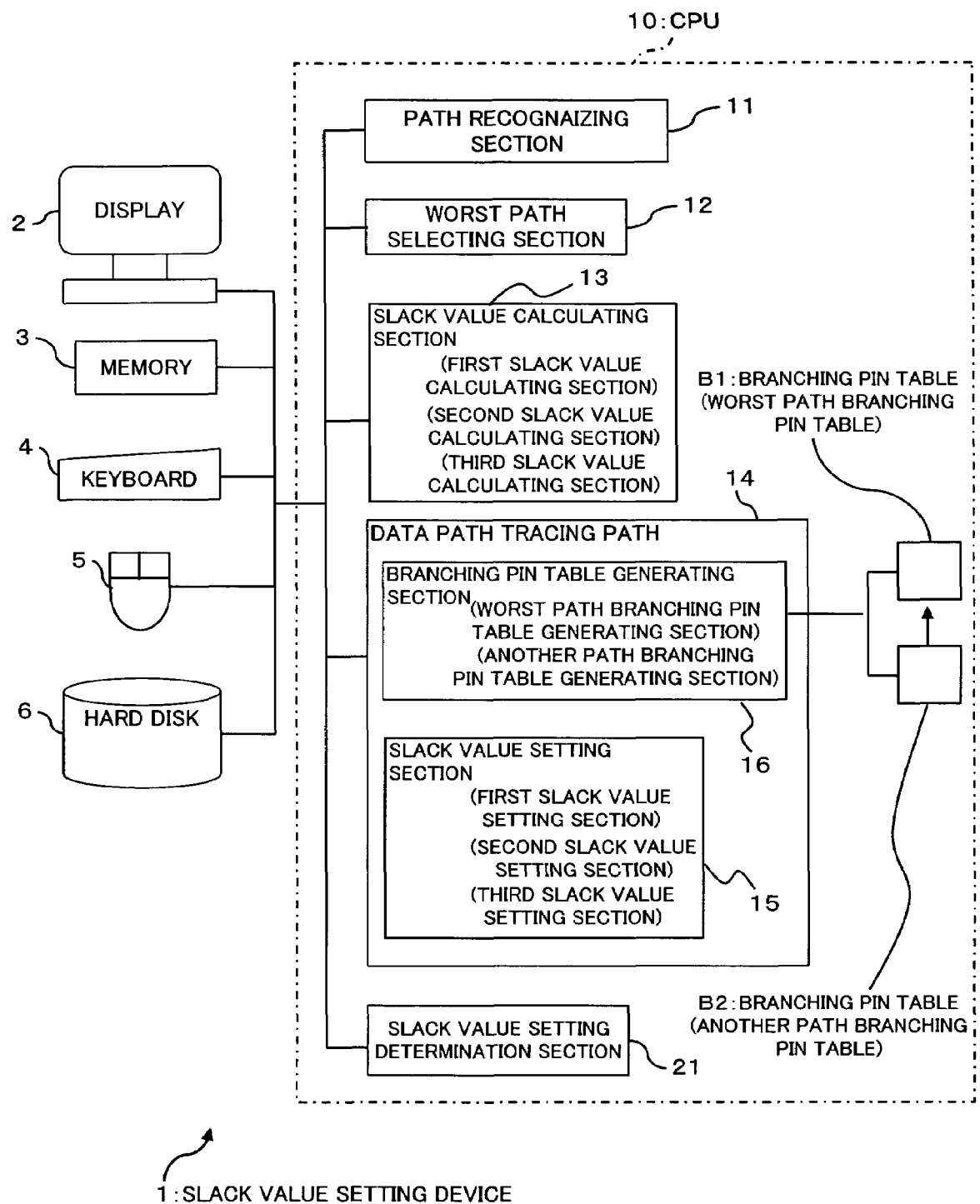
FIG. 1 is a block diagram showing a basic configuration of a slack value setting device as one embodiment of the present invention.

Hereinafter, referring to the drawings, embodiments of the present invention will be described.

Figure 2:
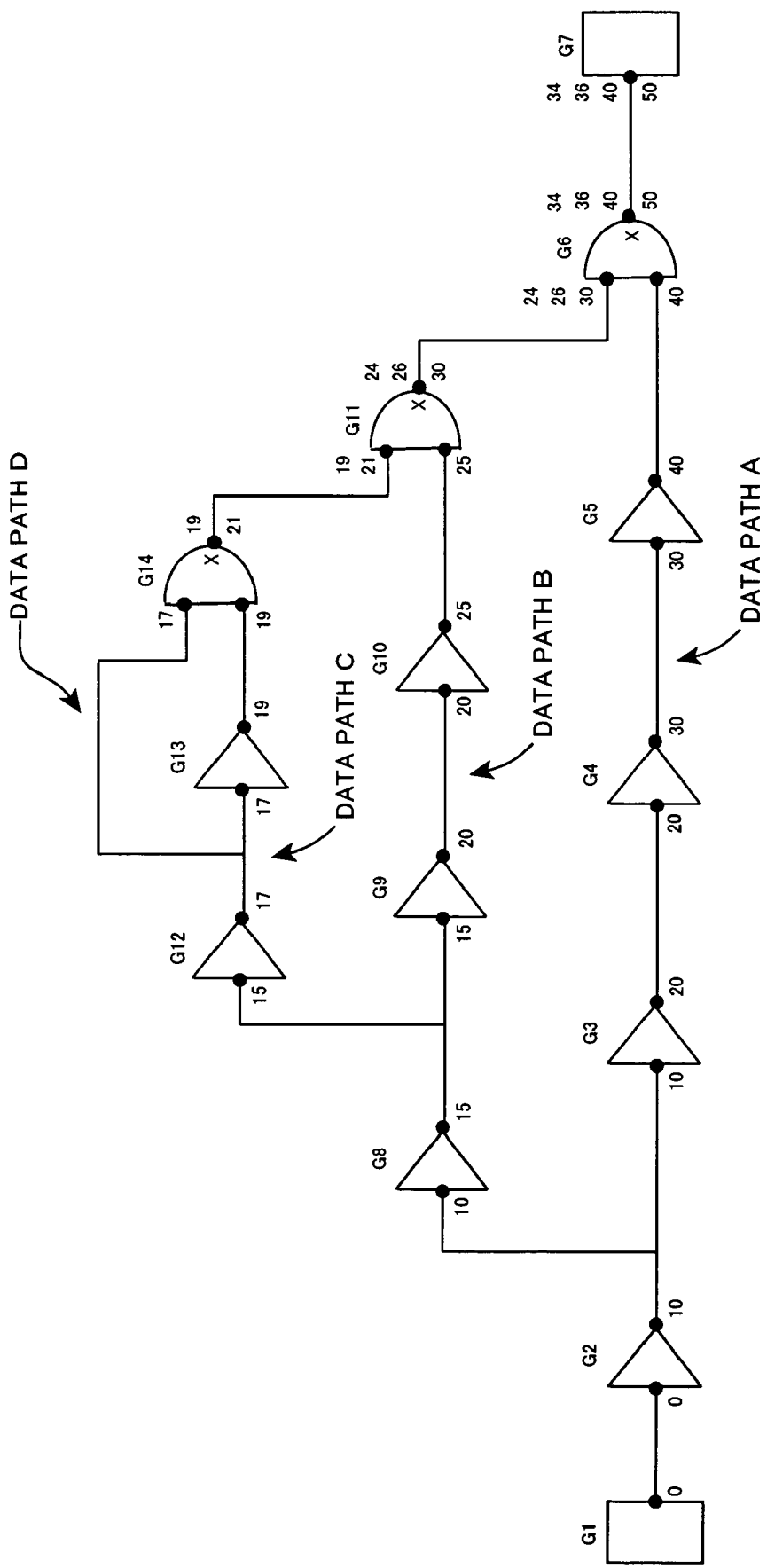
FIG. 2 is a diagram showing an example of an electronic circuit for setting slack value using the slack value setting device as on embodiment of the present invention.

FIG. 1 is a block diagram showing a basic configuration of a slack value setting device as one embodiment of the present invention. FIG. 2 is a diagram showing an example of an electronic circuit for setting slack value using the slack value setting device as one embodiment of the present invention.

The slack value setting device (evaluation value setting device) 1 is a device for setting a slack value as an evaluation value to each of the transit pins on a data path to determine and estimate whether or not the electronic circuit operates normally with respect to the electronic circuit (for example, integrated circuit such as LSI; refer to FIG. 2), which has branching pins, and accordingly, has a plurality of data paths (branch paths).

Here, the wording "slack value" means a difference between the maximum delay, which may be generated up to a device on the data path and an arriving time (allowable arriving time) allowed for the device, and the slack value indicates a margin of timing in the device.

The electronic circuit shown in FIG. 2 comprises a plurality of gates G1-G14. As the forward path, there are included four different (types) data paths; i.e., a data path A of gate G1→gate G2→gate G3→gate G4→gate G5→gate G6→gate G7, a data path B of gate G1→gate G2→gate G8→gate G9→gate G10→gate G11→gate G6→gate G7, a data path C of gate G1→gate G2→gate G8→gate G12→gate G13→gate G14→gate G11→gate G6→gate G7 and a data path D of gate G1→gate G2→gate G8→gate G12→gate G14→gate G11→gate G6→gate G7.

In the above gates G1-G14, the gate G1 and gate G7 are comprised of an FF (Flip-Flop) macro respectively; and the gates G2-G6, and G8-G14 are comprised of a gate macro respectively.

As shown in FIG. 1, the slack value setting device 1 comprises a computer system (information processing system) including a display 2, a memory 3, a keyboard 4, a mouse 5, a hard disk 6 and a CPU (Central Processing Unit) 10, and is adapted so as to work by a program (slack value setting program) stored in the memory 3 or the hard disk 6 executed by the CPU 10.

The display 2 displays various kinds of information such as electronic circuit as the object to be evaluated, evaluation result, and messages to the operator. The keyboard 4 and the mouse 5 are provided for the operator to carry out various operations such as inputting and selecting. The operator uses the keyboard 4 and the mouse 5 to designate feeder pin (start point) and receiver pin (end point) of the data path in electronic circuit. For example, FIG. 2 shows an example in which the operator has designated the output pin of the gate G1 as the feeder pin and the input pin of the gate G7 as the receiver pin using the keyboard 4 and the mouse 5.

The hard disk 6 stores various kinds of programs (OS (Operating System), a slack value setting program and the like) for operating the slack value setting device 1 and various kinds of data. For example, with respect to each of the logical elements constituting the electronic circuit, which is the object to be evaluated, (in the present invention, cell such as flip-flop, which will be occasionally called as gate or element), information such as delay (gate delay) at the gate is previously registered as, for example, gate information database.

The memory 3 temporarily stores data and/or programs. That is, when the CPU 10 performs operation or the like, the memory 3 temporarily stores and develops the data.

The CPU 10 performs various kinds of operations. By executing the program (slack value setting program) stored in the memory 3 or the hard disk 6, the CPU 10 works as a path recognizing section 11, a worst path selecting section 12, a slack value calculating section (first slack value calculating section, second slack value calculating section, third slack value calculating section) 13, a data path tracing section 14 and a slack value setting judgment section 21, which will be described later.

Accordingly, the slack value setting device 1 of this embodiment can be obtained by using a common calculating system, which has the CPU 10, the memory 3, the hard disk 6, the display 2, the keyboard 4, the mouse 5 and the like.

With respect to a section (data path) in an electronic circuit as the object to be evaluated, in which a feeder pin (start point) and a receiver pin (end point) are designated by the operator using the keyboard 4 and the mouse 5, the path recognizing section 11 performs a trace (forward trace) from the feeder pin toward the receiver pin to detect and recognize every path (transit pin and line connecting transit pins) included in the section between the feeder pin and the receiver pin.

Hereinafter, with respect to the electronic circuit as the object to be evaluated, a trace from the feeder pin toward the receiver pin will be referred to as forward trace. On the other hand, a trace from the receiver pin toward the feeder pin will be referred to as backward trace.

The path recognizing section 11 is adapted so as, when performing the forward trace, for example, based on a gate information database previously registered in the hard disk 6, to acquire the delay (gate delay) of the respective gates constituting the data path and the delay in the respective lines connecting the gates, and integrate such delays on the basis of data path to calculate the delay (path delay) of the entire paths with respect to each of the data paths.

In the example shown in FIG. 2, each of the path delays of the data path A, the data path B, the data path C and the data path D are 50, 40, 36 and 34 respectively. It is assumed that the delay of the line connecting the transit pins is 0.

The worst path selecting section 12 selects a worst path from a plurality of data paths recognized by the path recognizing section 11. In this embodiment, it is adapted to select two kinds of worst paths; i.e., the worst path relevant to the over delay and the worst path relevant to the racing.

That is, the worst path selecting section 12 is adapted so as to select a data path having the largest path delay as the worst path relevant to the over delay, and a data path having the smallest path delay as the worst path relevant to the racing from the plurality of the data paths recognized by the path recognizing section 11.

In the example shown in FIG. 2, the path-A is the worst path relevant to the over delay, and the path-D is the worst path relevant to the racing. Hereinafter, data path other than the worst path in the plurality of the data paths will be occasionally referred to as another path. In the example shown in FIG. 2, paths B, C and D are the another paths relevant to the over delay; and paths A, B and C are the another paths relevant to the racing.

In this embodiment, for convenience, the worst path relevant to the over delay in a plurality of data paths is defined as the most superior data path. And it is defined with respect to the another paths branching from the worst path that a path having the larger number of branch paths, which are interposed between the worst path and the same, is the more inferior data path. That is, in the example shown in FIG. 2, it is defined as below; i.e., the data path A is the most superior data path, and is followed by the data path B and the data path D in this order, and the data path D is the most inferior data path.

The slack value calculating section (first slack value calculating section, second slack value calculating section and third slack value calculating section) 13 calculates the slack values to be set to each of the transit pins. In the embodiment, it is adapted to calculate each of the slack value relevant to the over delay (max-delay; hereinafter, represented by a symbol SOn) and the slack value relevant to the racing (min-delay; hereinafter, represented by a symbol SRn) wherein n is an integral number.

The slack value calculating section (first slack value calculating section) 13 is adapted so as to set (pass on) "0" as the initial value of the slack value (initial slack value; SO0, SR0) to each of the transit pins on the worst path with respect to both of the over delay and the racing (SO0=0, SR0=0).

The slack value calculating section (second slack value calculating section and third slack value calculating section) 13 is adapted as described below. That is, when calculating the slack value SOn relevant to the over delay, with respect to the transit pins on the another paths, the path delay of the data path at the superior side in the relevant branching pins is subtracted by the path delay of the data path at the inferior side to obtain a delay difference between the two paths in the branching pin as the start point of the another path. The delay difference d of two data paths, which is obtained as described above, is subtracted from the path delay of the data path at the superior side to obtain the slack value SOn to be set to each of the transit pins on the another path, which has the branching pin as the start pin.

On the other hand, the slack value calculating section (second slack value calculating section and third slack value calculating section) 13 is adapted as described below. That is, when calculating the slack value SRn relevant to the racing, with respect to the transit pins on the another paths, the path delay of the data path at the superior side in the branching pins is subtracted by the path delay of the data path at the inferior side to obtain a delay difference between the two paths in the branching pin as the start point of the another path. The delay difference d of two data paths, which is obtained as described above, is subtracted from the path delay of the data path at the inferior side (i.e., worst path relevant to the racing) (i.e., 0) to obtain the slack value SRn to be set to each of the transit pins on the another path, which has the branching pin as the start pin.

The data path tracing section (worst path tracing section, another path tracing section) 14 is for performing backward trace of the data path recognized by the path recognizing section 11 from the receiver pin side (in the example shown in FIG. 2, the input pin of the gate G7) toward the feeder pin (the output pin of the gate G1).

First of all, the data path tracing section 14 carries out a backward trace on the worst path from the receiver pin, which is designated by the operator as the start pin, up to the feeder pin, which is also designated by the operator. Then, a backward trace is made on the another path having the branching pin in the backward direction in the worst path as the top pin. When there resides a plural branching pins in the worst path, a backward trace on the another path having the branching pin is made in order from the branching pin closest to the receiver pin as the top pin.

In the example shown in FIG. 2, the output pin X of the gate G6 is the branching pin in the backward direction in the worst path. In this embodiment, the output pin X of the gate G6 as described above is represented by a symbol G6.X. Hereinafter, the branching pin will be represented by a combination of a symbol indicating the gate and a symbol X indicating the output pin.

Also, when a branching pin is included in the another path, the data path tracing section 14 carries out the backward trace on the different another path using the branching pin in the another path as the top pin. Further, when plural branching pins are included in the another path, the data path tracing section 14 carries out backward trace on these another paths using each of the branching pin as the top pin in order from the branching pin closest to the receiver pin in these another paths.

Specifically, first of all, the data path tracing section 14 carries out a backward trace on the worst path up to the feeder pin using the designated receiver pin as the start pin. And then, referring to the branching pin table B1 generated by a branching pin table generating section 16, which will be described later, the data path tracing section 14 carries out a backward trace until a transit pin, of which slack value has been processed (slack value has been set up thereto; which will be described later), is detected on the another path having a branching pin registered in the branching pin table B1 as the top pin. The backward trace on the another path is carried out repeatedly on every branching pin registered in the branching pin table B1.

As shown in FIG. 1, the data path tracing section 14 comprises a slack value setting section (first slack value setting section, second slack value setting section, third slack value setting section) 15 and a branching pin table generating section (worst path branching pin table generating section, another path branching pin table generating section) 16.

The branching pin table generating section (worst path branching pin table generating section, another path branching pin table generating section) 16 is adapted so as to pick out the transit pin during the backward trace of the data path and determine whether or not the transit pin is the branching pin relevant to the backward trace. And when the transit pin is the branching pin relevant to the backward trace, the transit pin (branching pin) is registered in the branching pin table B1. That is, the branching pin table generating section 16 is adapted so as to register the branching pins in the branching pin table B1 in the order of appearance; i.e., in order from the branching pin closest to the receiver pin, during the backward trace on the data paths.

The branching pin table B1 registers the branching pins on the data path in a predetermined order. In this embodiment, the branching pin table B1 is adapted so as to register the branching pins in order from the branching pin closest to the receiver pin. The branching pin table (another path branching pin table) B2 registers branching pins on the another path in a predetermined order. In this embodiment, it is adapted so that the branching pins are registered in order from the branching pin closest to the receiver pin.

The branching pin table generating section (worst path branching pin table generating section) 16 is adapted so as, when a backward trace on the worst path (in the example shown in FIG. 2, path A) selected by the worst path selecting section 12 is carried out, to pick out the branching pins in order in the backward direction on the worst path. And these branching pins are registered in the branching pin table (worst path branching pin table) B1 in a predetermined order (pick-out order).

Further, the branching pin table generating section (another path branching pin table generating section) 16 is adapted so as, when carrying out the backward trace on these another paths, to pick out the branching pins in the backward direction on these another paths to register these branching pins in the branching pin table B2 in a predetermined order (pick-out order).

In this embodiment, the branching pin table B2 is adapted so as to register the branching pins to be the start pins in these another paths, which have not been subjected the backward trace. Further, it is adapted so that, every time when the backward trace completes on one another path, the branching pin table B1 is updated based on the branching pin table B2, and when the update has completed, the branching pin table B2 is reset (initialized).

The slack value setting sections (first slack value setting section, second slack value setting section, third slack value setting section) 15 set up slack values, which are set up by the slack value calculating sections (first slack value calculating section, second slack value calculating section, third slack value calculating section) 13, to each of the transit pins on the data paths.

The slack value setting section (first slack value setting section) 5 is adapted so as, when carrying out the backward trace in the worst path, to set up slack values (initial slack value SO0=0, SR0=0), which are set up by the slack value calculating section 13 to each of the transit pins on the worst path. Also, the slack value setting sections (second slack value setting section, third slack value setting section) 15 are adapted so as to set up slack values SOn, SRn, which are calculated by the slack value calculating sections (second slack value calculating section, third slack value calculating section) 13, to each of the transit pins on these another paths.

Specifically, the slack value setting sections (second slack value setting section, third slack value setting section) 15 carry out the backward trace on another paths, which have the branching pins stored in the branching pin table B1 as the start pins, based on the branching pin table B1 generated by the branching pin table generating section 16, and set up slack values SOn, SRn calculated by the slack value calculating sections 13 to each of the transit pins on the another paths. As for the transit pins to which the slack values SOn, SRn have been set up (passed on; i.e., processed), no slack values are passed on any more.

The slack value setting determination section 21 determines whether or not the slack values have been set up to the branching pins on the data paths. In this embodiment, the slack value setting determination section 21 checks whether or not the branching pin table B2 is empty to determine whether or not the slack values has been set up to the branching pins on the data paths. When the branching pin table B2 is empty, it is determined the slack values have been set up to every transit pin on the data paths.

The slack value calculating section 13 and the data path tracing section 14 are adapted so as to repeatedly carry out the calculation of the slack values, the generating of the branching pin tables and setting of the slack values until it is determined that the slack values has have been set up to every transit pin on the data paths by the slack value setting determination section 21.

Figure 3:
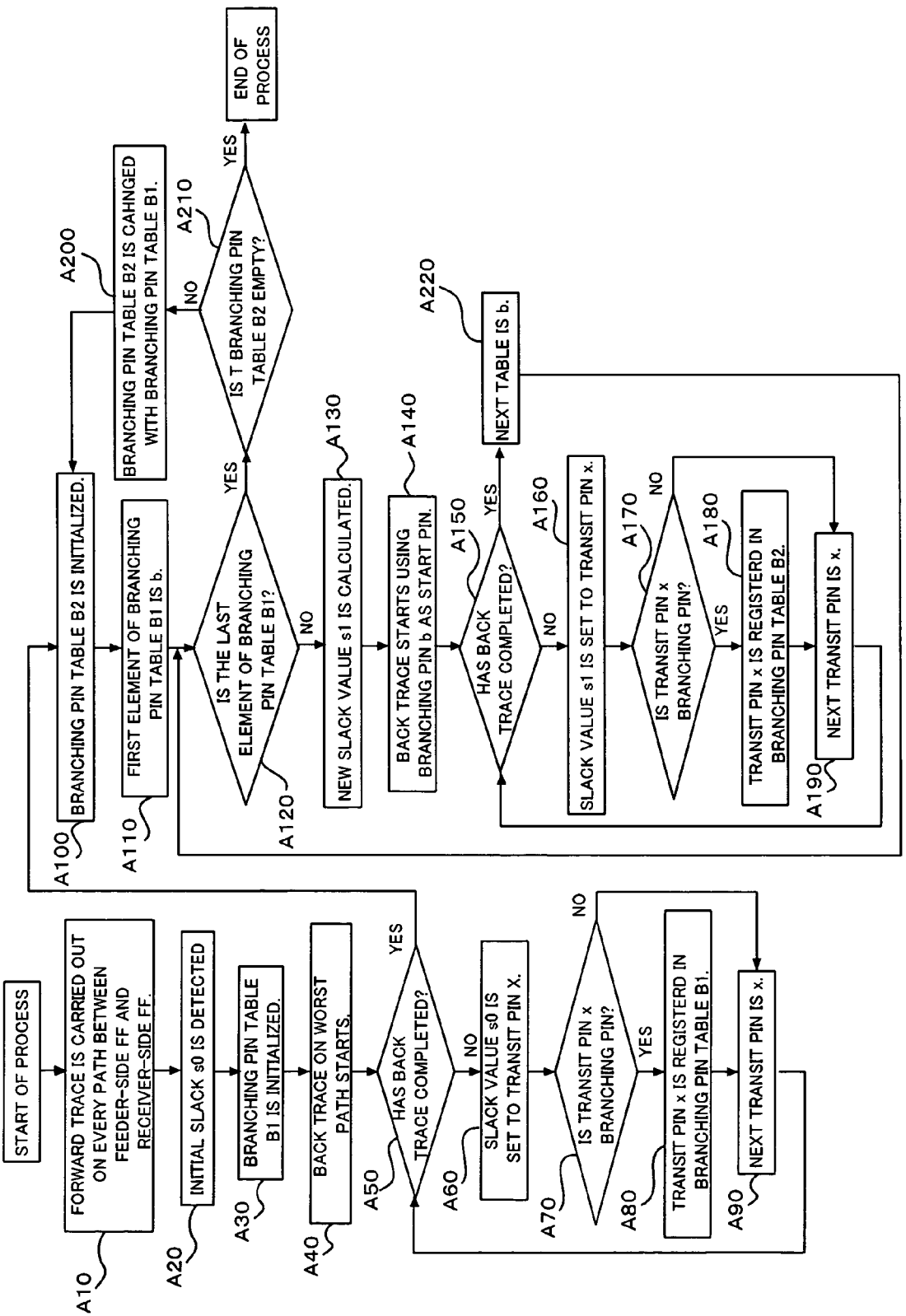
FIG. 3 is a flowchart for illustrating a setting technique of slack value using the slack value setting device as one embodiment of the present invention.

Based on the flowchart (steps A10-A220) shown in FIG. 3, the setting technique of slack values by the slack value setting device 1 as one embodiment of the present invention, which is configured as described above, will be described below.

First of all, the path recognizing section 11 carries out a forward trace from the feeder pin of feeding side FF to the receiver pin of the receiving side FF (step A10). Thereby, every path route between the feeding side FF and the receiving side FF is recognized, and gate delays of the gates disposed on these path routes are acquired. The gate delays are stored in a database (for example, a table in the memory). Based on these gate delays, the worst path selecting section 12 selects the worst path, which has the largest path delay, from every path route between the feeding side FF and the receiving side FF.

The slack value calculating section (first slack value calculating section) 13 calculates initial slack values SO0, SR0 to be set up to the worst path (step A20). In this embodiment, SO0, SR0=0.

The branching pin table generating section 16 initializes the branching pin table B1 (step A30), and with respect to the worst path, starts the backward trace from the receiving side FF toward the feeding side FF (step A40). Hereinafter, in the figure, the backward trace will be referred to as back trace.

The branching pin table generating section 16 checks whether or not the backward trace of the worst path has completed (step A50). When the backward trace has not completed (refer to NO route in step A50), the initial slack values SO0, SR0 calculated in step A20 are set up to the transit pin x (step A60).

Further, it is determined whether or not the transit pin x is the branching pin relevant to the backward trace (step A70). When the transit pin x is the branching pin (refer to YES route step A70), the transit pin x is registered in the branching pin table B1 (step A80), and the next transit pin is set as x (step A90). When the transit pin x is not the branching pin (refer to NO route in step A70), the process proceeds to step A90.

When the backward trace has completed (refer to YES route in step A50), the branching pin table B2 is initialized (step A100), and the first element (branching pin) in the branching pin table B1 is acquired and set as b (step A110). It is determined whether or not this b is the last element of the branching pin table B2 (step A120). When the b is not the last element (refer to NO route in step A120), slack values SOn, SRn to be set up to each of the transit pins of the another path, which has the b as the start pin, are calculated (step A130).

Then, a backward trace of the another path, which has the branching pin b as the start pin, starts (step A140). It is checked whether or not the backward trace of the another path relevant to the branching pin has completed (step A150). When the backward trace has not completed (refer to NO route in step A150), the slack values SOn, SRn calculated in step A130 are set up to the transit pin x (step A160).

Further, it is determined whether or not the transit pin x is the branching pin (step A170). When the transit pin x is the branching pin (refer to YES route in step A170), the transit pin x is registered in the branching pin table B2 (step A180), the next transit pin is set as x (step A190), the process returns to step A150. On the other hand, when the transit pin x is not the branching pin, (refer to NO route in step A170), the process returns to step A190.

When the backward trace has completed, (refer to YES route in step A150), the next element in the branching pin table B2 is set as b (step A220), and the process returns to step A150.

On the other hand, when the b is the last element in the branching pin table B1 (refer to YES route in step A120), it is checked whether or not the branching pin table B2 is empty; that is, whether or not there resides any branching pin registered in the branching pin table B2 (step A210). When the branching pin table B2 is empty (refer to YES route in step A210), the processing is terminated. When the branching pin table B2 is not empty (refer to NO route in step A210), the branching pin table B2 is changed to the branching pin table B1 (step A200), the process returns to step A100.

As described above, by carrying out the processing (steps A10-A220), slack values can be set up to every transit pin on the data paths.

Next, referring to FIG. 4 to FIG. 7, the process to set up slack values of the over delay (max-delay) to an electronic circuit shown in FIG. 2 by the slack value setting device 1 as one embodiment of the present invention will be described. FIG. 4 to FIG. 7 are diagrams respectively showing the setting process of slack values relevant to the over delay by the slack value setting device 1; each of the figures is the diagram showing picked out data path in the electronic circuit shown in FIG. 2.

Figure 4:
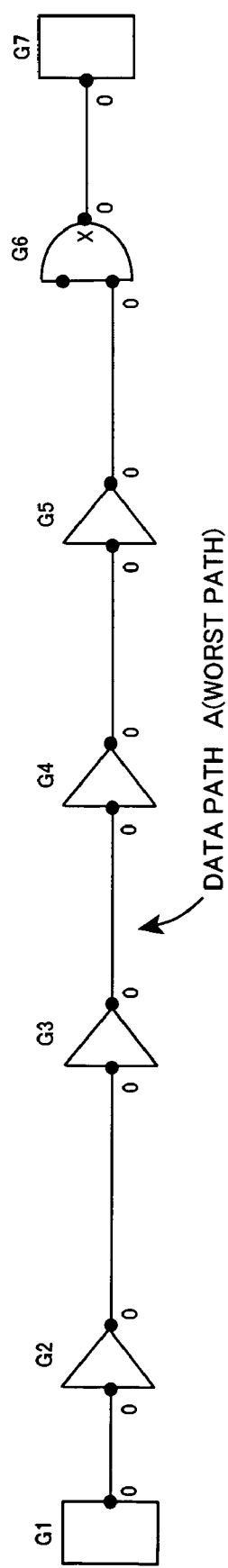
FIG. 4 is a diagram showing a setting process of slack value relevant to over delay using the slack value setting device as one embodiment of the present invention.

As shown in FIG. 4, first of all, the data path tracing section 14 carries out a backward trace on the worst path (data path A) having the max-delay, and sets up the initial slack value (in this embodiment, initial slack value SO0=0) to each of the transit pins. And by the backward trace on the data path A, the branching pin G6.X is detected.

Figure 5:
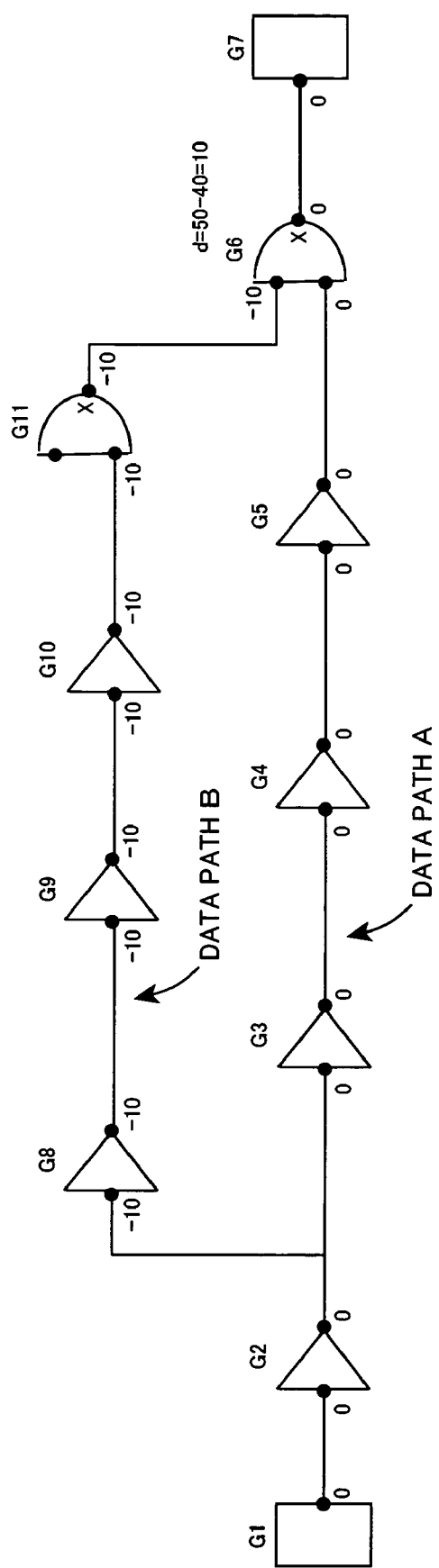
FIG. 5 is a diagram showing a setting process of slack value relevant to the over delay using the slack value setting device as one embodiment of the present invention.

Next, as shown in FIG. 5, using the branching pin G6.X detected by the backward trace on the worst path as the start pin of the next new backward trace, the slack value calculating section 13 sets up the value "−10", which is the value subtracted by delay difference d=50−40=10 between the data path A (worst path) and the data path B at the branching pin G6.X from the slack value 0 of the data path A, to each of the transit pins on the data paths B as the new slack value SOn.

Each of the transit pins of the gates G2, G1, which are passed through in the backward trace of the data path B has been set up with the slack value SO0=0. Since the slack value SOn=−10 of the data path B is smaller than these existing values "0", slack values set up to each of the transit pins of these gates G1, G2 are not updated. By the backward trace of the data path B, the branching pin G11.X is detected.

Figure 6:
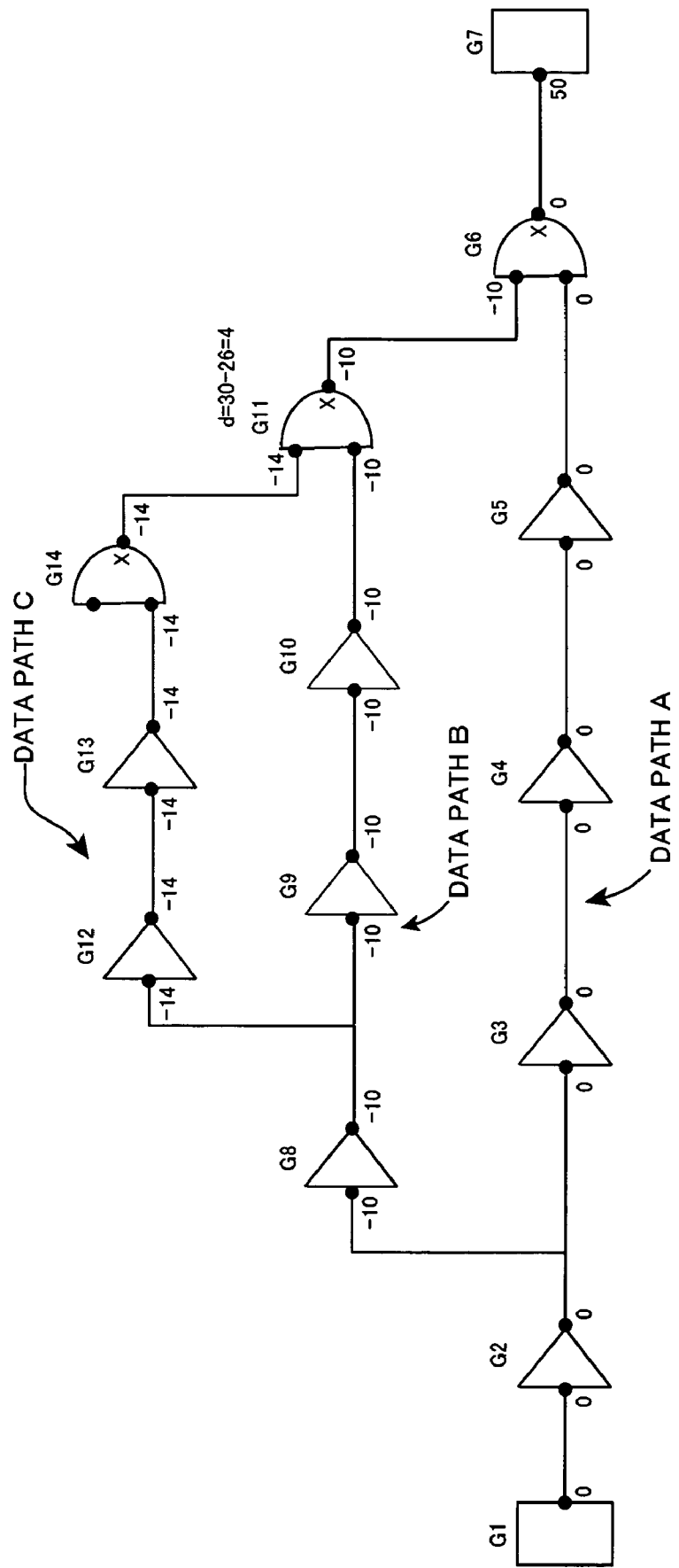
FIG. 6 is a diagram showing a setting process of slack value relevant to the over delay using the slack value setting device as one embodiment of the present invention.

Next, as shown in FIG. 6, using the branching pin G11.X detected in the backward trace of the data path B shown in FIG. 5 as the start pin of the next new backward trace, the slack value calculating section 13 sets up the value "−14", which is obtained by subtracting the delay difference d=30−26=4 between the data path B and the data path C in the branching pin G11.X from the slack value −10 of the data path B, as a new slack value SOn to each of the transit pins on the data path C. To each of the transit pins of the gates G8, G2 and G1, which are passed through in the backward trace of the data path C, slack values SOn=−10 and 0 have been set up. Since the slack value SOn=−14 of the data path C is smaller than these existing values "−10" and "0", the slack values set up to each of the transit pins of the gates G8, G2 and G1 are not updated. By the backward trace of the data path C, the branching pin G14.X is detected.

Figure 7:
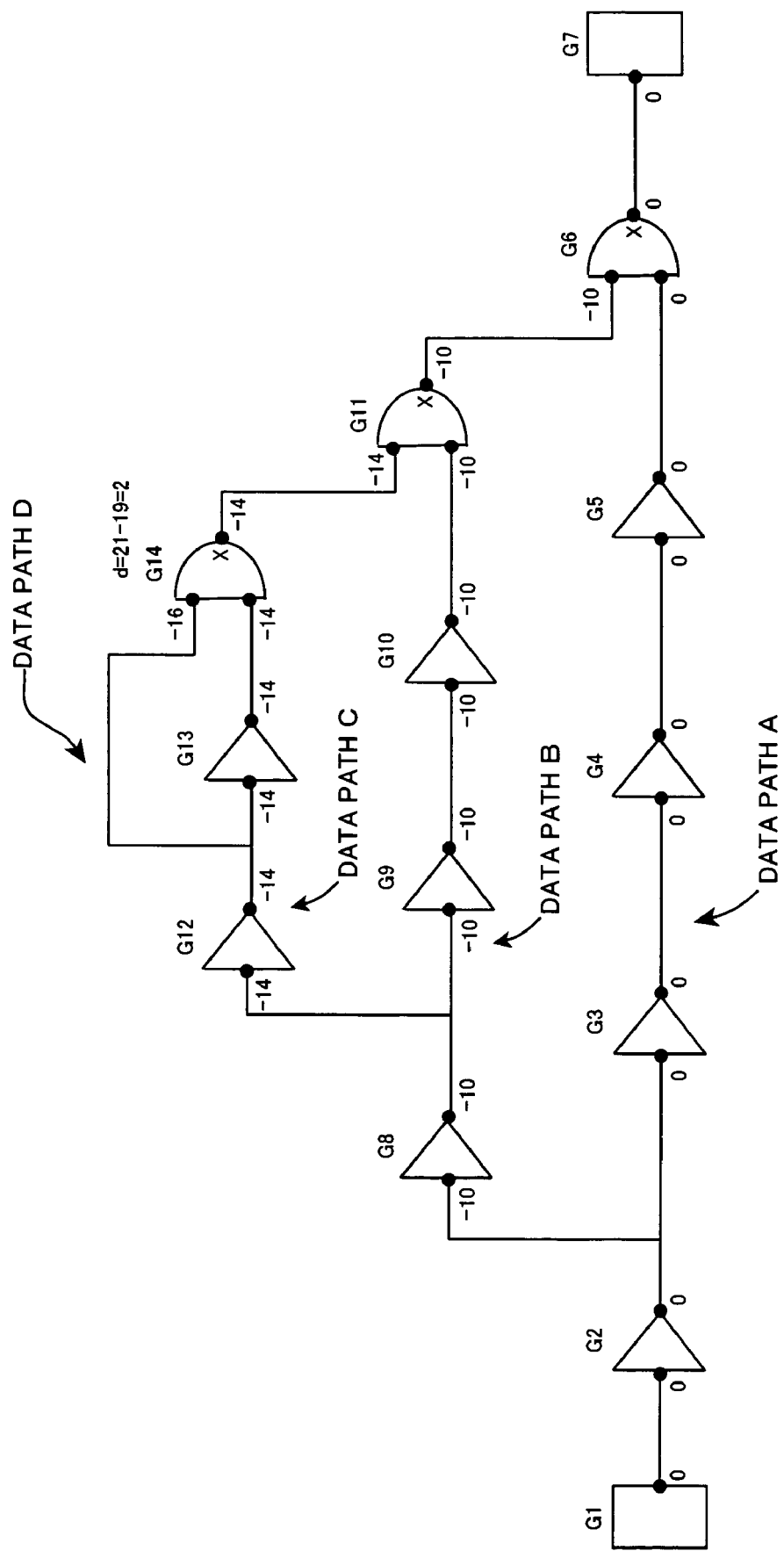
FIG. 7 is a diagram showing a setting process of slack value relevant to the over delay using the slack value setting device as one embodiment of the present invention.

Next, as shown in FIG. 7, using the branching pin G14.X detected in the backward trace of the data path C shown in FIG. 6 as the start pin of the next new backward trace, the slack value calculating section 13 sets up a value "−16", which is obtained by subtracting the delay difference d=21−19=2 between the data path C and the data path D in the branching pin G14.X from the slack value −14 of the data path C as a new slack value SOn to each of the transit pins on the data path D. To each of the transit pins of the gates G12, G8, G2 and G1, which are passed through in the backward trace of the data path D, slack values SOn=−14, −10, and 0 have been set up. Since the slack value −16 of the data path D is smaller than the existing values "−14", "−10" and "0", the slack values set up to each of the transit pins of the gates G12, G8, G2 and G1 are not updated.

As described above, the backward trace processing is carried out three times on the transit pins of every data path from the FF macro G1 up to the FF macro G7 by the slack value setting device 1. Thereby, the slack value having the max-delay is set up.

Next, referring to FIG. 8-FIG. 11, the process to set up slack values of the racing (min-delay) in an electronic circuit shown in FIG. 2 by the slack value setting device 1 as one embodiment of the present invention will be described. FIG. 8-FIG. 11 are diagrams showing the setting process of the slack values relevant to the racing by the slack value setting device 1. Each of the figures shows picked out data paths in the electronic circuit shown in FIG. 2.

Figure 8:
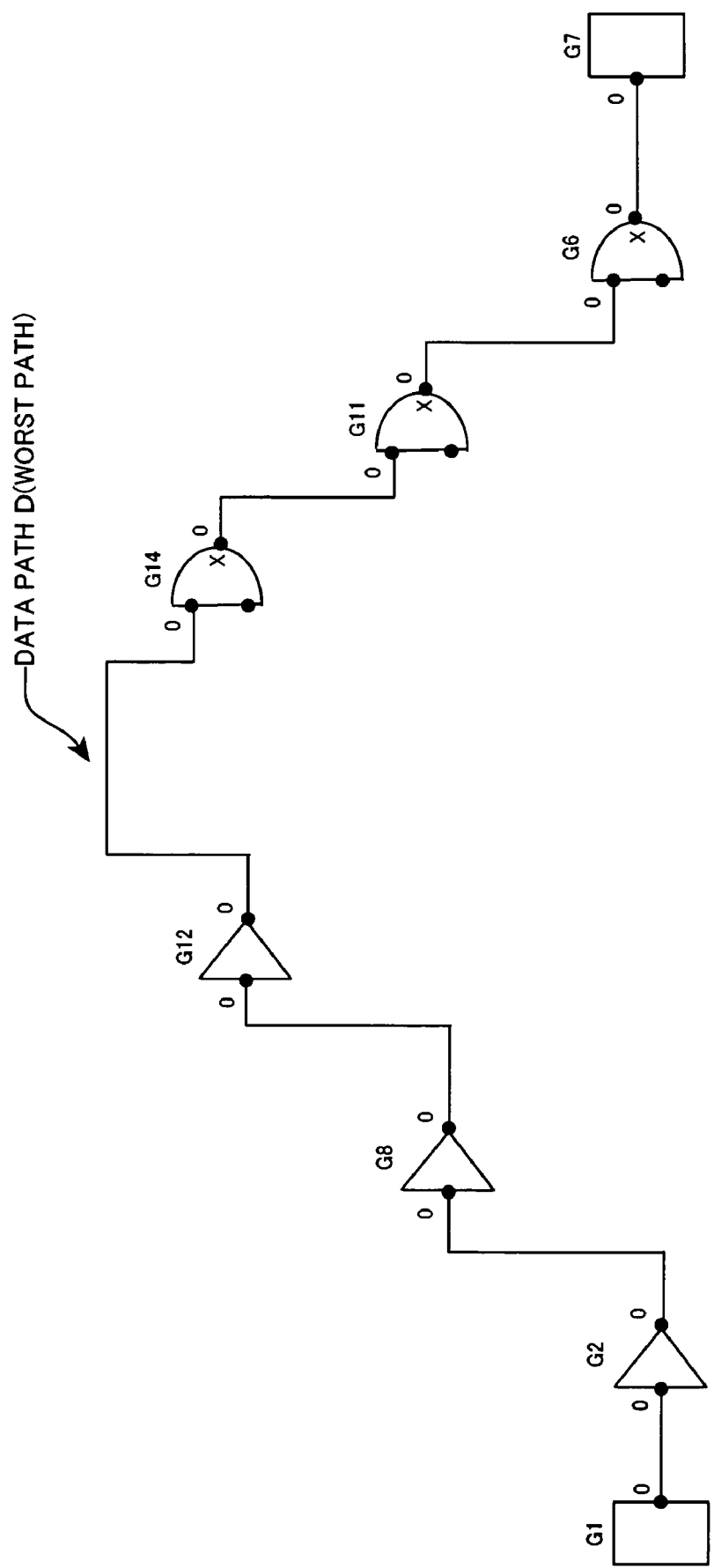
FIG. 8 is a diagram showing a setting process of slack value relevant to racing using the slack value setting device as one embodiment of the present invention.

As shown in FIG. 8, first of all, the data path tracing section 14 carries out a backward trace on the worst path (data path D) having the min-delay. To each of the transit pins, the initial slack value (in this embodiment, initial slack value SR0=0) is set up. By the backward trace of the data path D, the branching pins G6.X, G11.X and G14.X are detected.

Figure 9:
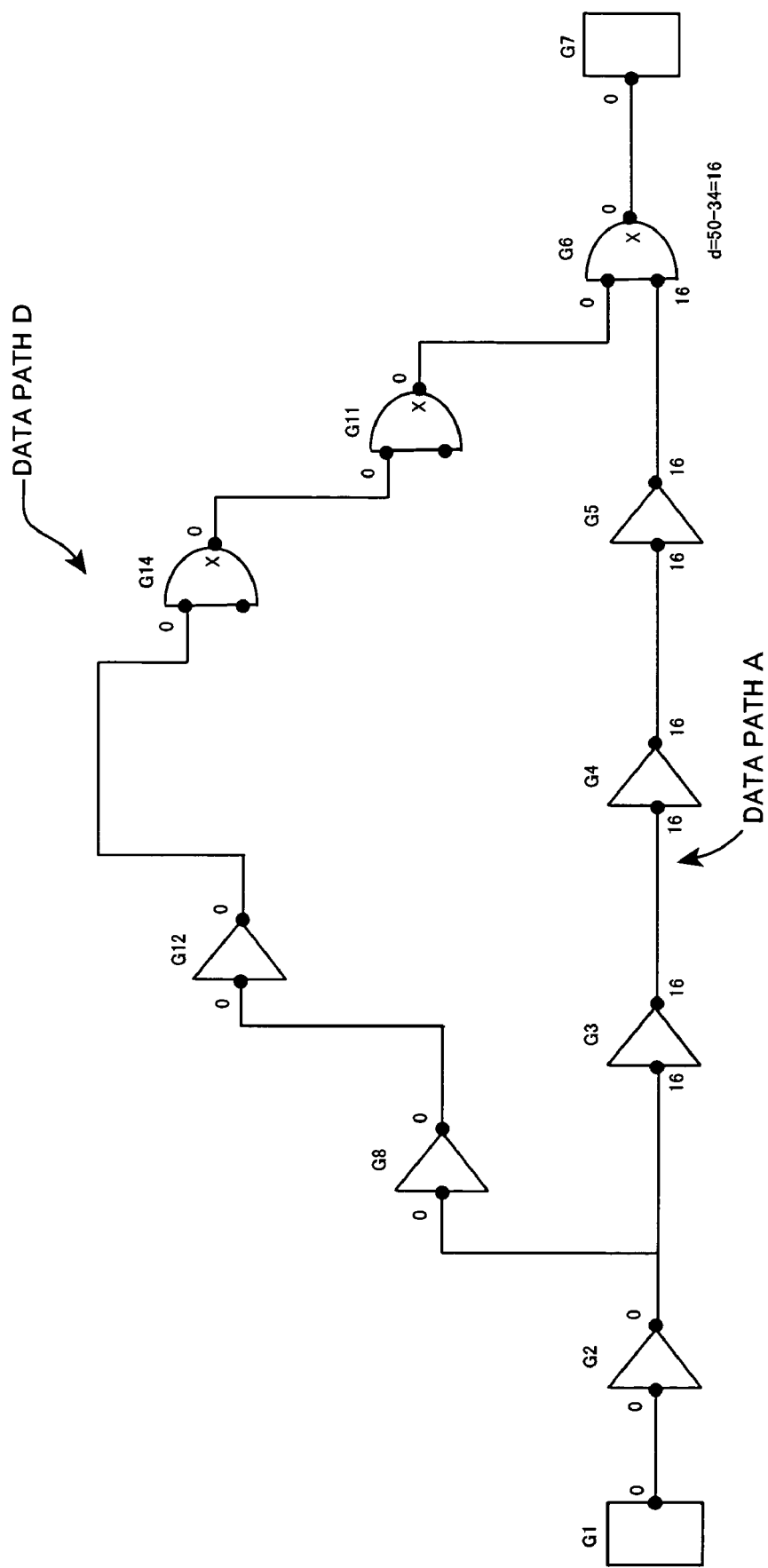
FIG. 9 is a diagram showing a setting process of slack value relevant to the racing using the slack value setting device as one embodiment of the present invention.

Next, as shown in FIG. 9, using the branching pin G6.X in a plural branching pins G6.X, G11.X and G14.X, which are detected by the backward trace of the worst path, as the start pin of the next new backward trace, the slack value calculating section 13 sets up a value "16", which is obtained by adding the delay difference d=50−34=16 between the data path A and the data path D (worst path) at the branching pin G6.X to the slack value SR0=0 of the data path D, to each of the transit pins on the data path A as a new slack value SRn.

The slack value "0" has been set up to each of the transit pins of the gates G2 and G1, which are passed through in the backward trace of the data path A. Since the slack values SRn=16 of the data path A are larger than the existing values "0", the slack values set up to each of the transit pins of the gates G1 and G2 are not updated.

Figure 10:
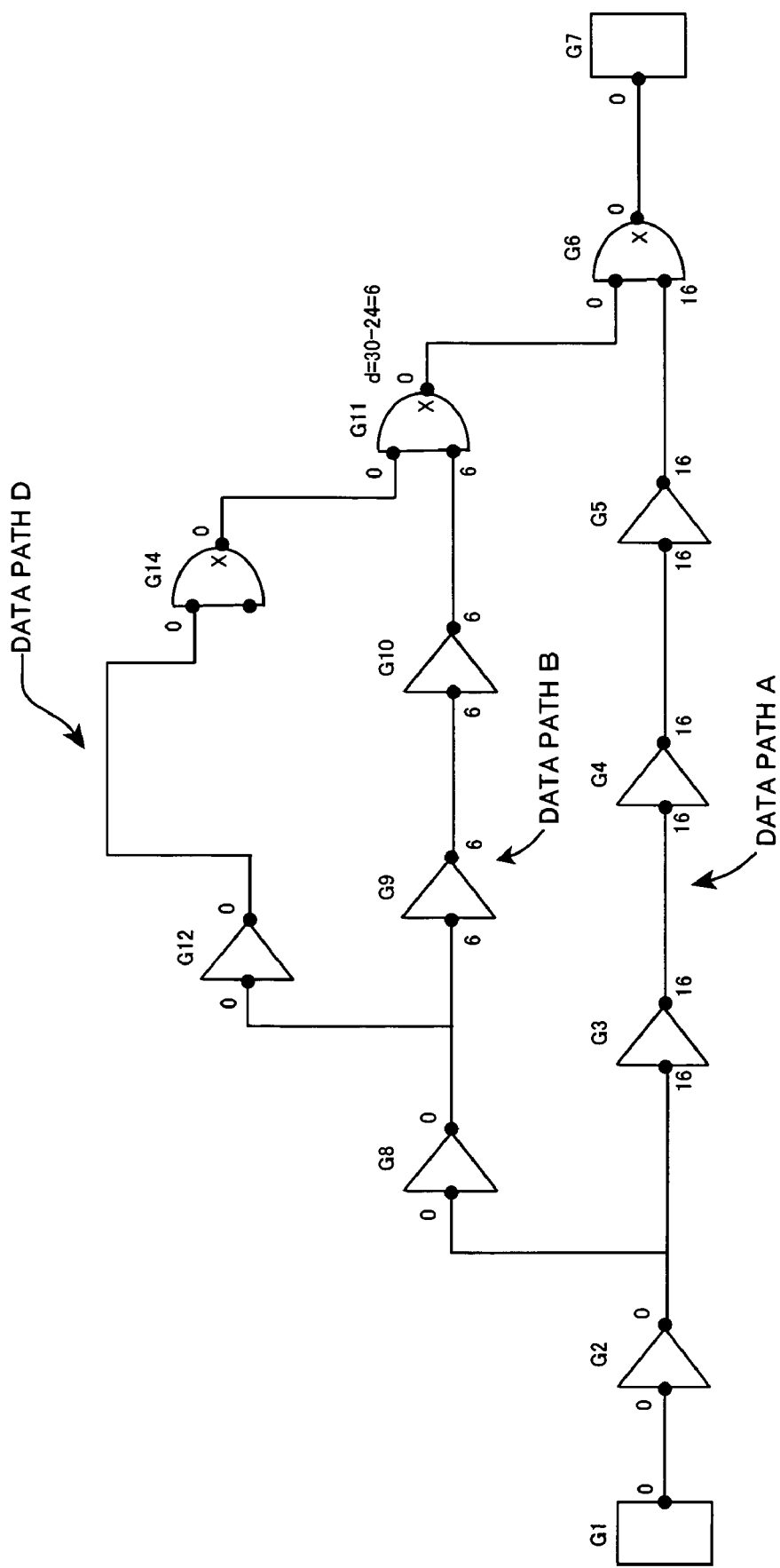
FIG. 10 is a diagram showing a setting process of slack value relevant to the racing using the slack value setting device as one embodiment of the present invention.

Next, as shown in FIG. 10, using the branching pin G11.X detected by the backward trace of the worst path shown in FIG. 8 as the start pin of the next new backward trace, the slack value calculating section 13 sets up a value "6", which is obtained by adding the delay difference d=30−24=6 between the data path B and the data path D in the branching pin G11.X to the slack value SR0=0 of the data path D, to each of the transit pins on the data path B as a new slack value SRn. To each of the transit pins of the gates G8, G2 and G1, which are passed through in the backward trace of the data path B, slack values SR0=0 have been set up respectively. Since the slack value SRn=6 of the data path B is larger than the existing values "0", the slack values set up to each of the transit pins of the gates G8, G2 and G1 are not updated.

Figure 11:
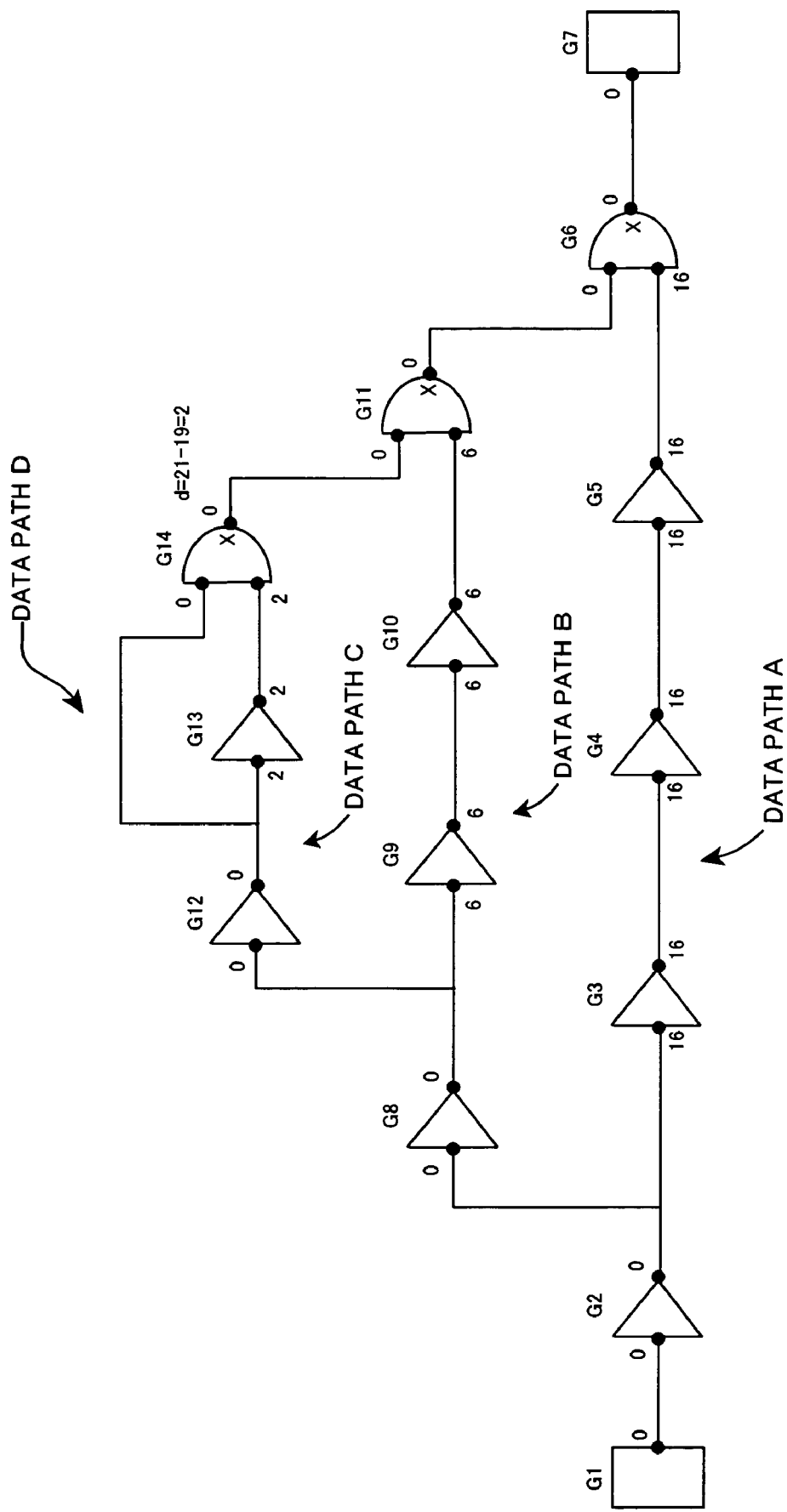
FIG. 11 is a diagram showing a setting process of slack value relevant to the racing using the slack value setting device as one embodiment of the present invention.

Next, as shown in FIG. 11, using the branching pin G14.X detected by the backward trace of the worst path as the start pin of the next new backward trace, the slack value calculating section 13 sets up a value "2", which is obtained by adding a delay difference d=21−19=2 between the data path C and the data path D at the branching pin G14.X to the slack value SR0=0 of the data path D, to each of the transit pins on the data path C as a new slack value SRn. To each of the transit pins of the gates G12, G8, G2 and G1, which are passed through in the backward trace of the data path C, the slack values SR0=0 have been set up respectively. Since the slack value SRn=2 of the data path C is larger than the existing values "0", the slack values set up to each of the transit pins of the gates G12, G8, G2 and G1 are not updated.

As described above, the backward trace processing is carried out three times to the transit pins in every data path from the FF macro G1 to the FF macro G7 by the slack value setting device 1, the slack values having the min-delay are set up.

Figure 12:
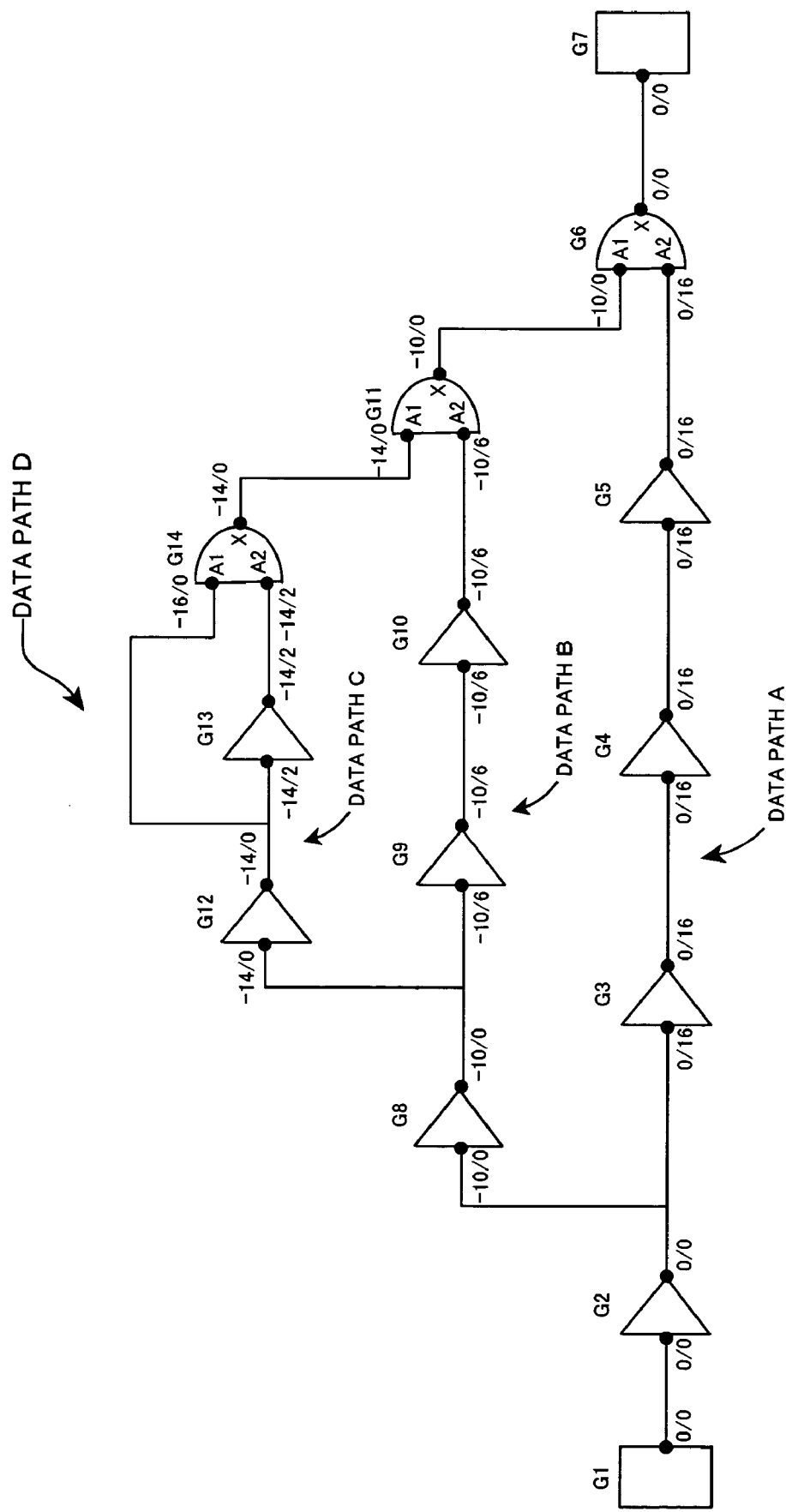
FIG. 12 is a diagram showing a max-delay slack value and a min-delay slack value being synthesized on the same electronic circuit using the slack value setting device as one embodiment of the present invention.

FIG. 12 is a diagram showing the slack values of max-delay and the slack values of min-delay, which are set up by the slack value setting device 1 as one embodiment of the present invention, being synthesized with each other on the same electronic circuit. In FIG. 12, with respect to each of the transit pin, the slack value SOn of max-delay and the slack value SRn of min-delay are disposed being interposed by a slash (/), thus, the slack value of max-delay and the slack value of the min-delay at each transit pin are simultaneously represented as being (SOn/SRn).

In the example shown in FIG. 12, in the transit pins, which has slack value 0/0 such as the output pin of the gate G1, input and output pins of the G2 and branching pin G6.X, there is no margin in both of the max-delay and the min-delay. Accordingly it is understood that, when a correction is made on the circuit by inserting a buffer or replacing the macros in front and behind these transit pins, a large influence is given to the timing.

Also, in the example shown in FIG. 12, it is understood that in the transit pin G6.A2, there is no margin at the max-delay side, but there is a margin at the min-delay side. In this case, it is understood that a correction to make the delay smaller in front or behind of a transit pin on the data path, which has a slack value 0/6 such as the input and output pins of the gates G3, G4 and G5 and the transit pin G6.A2, is possible. On the other hand, in the transit pin G14.A1, it is understood that there is a margin at the max-delay side; but there is no margin at the min-delay side. In this case, it is understood that a correction to make the delay larger in front/behind of the transit pin having the slack value −16/0 on the data path is possible.

Next, an example in which slack values are set up in an electronic circuit having more complicated data paths using the slack value setting device 1 as one embodiment of the present invention will be described.

Figure 13:
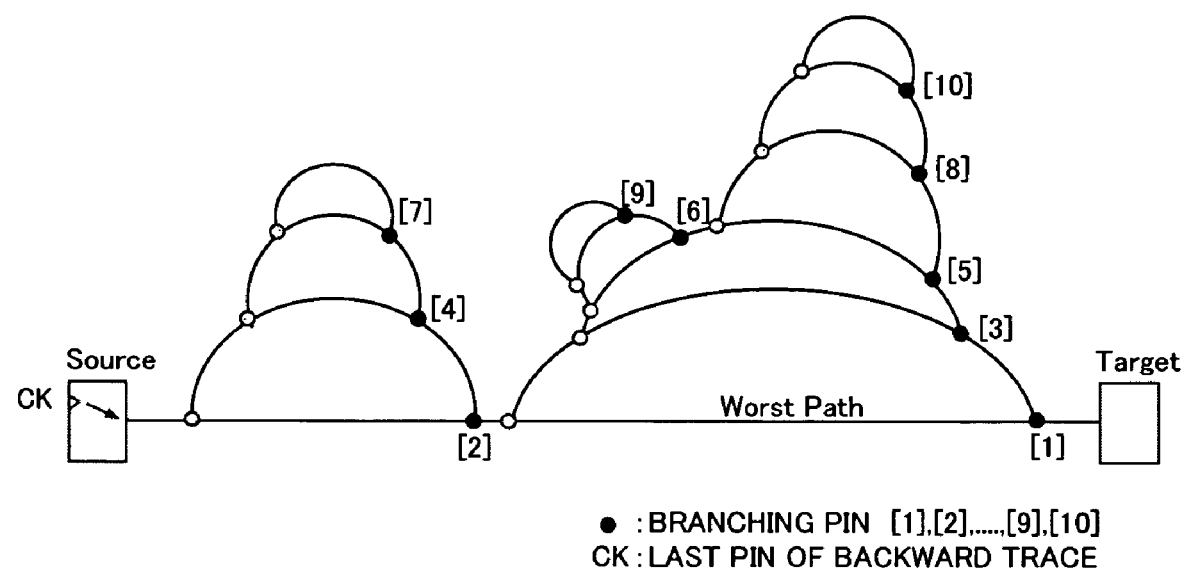
FIG. 13 is a diagram showing an example of another electronic circuit for setting slack value using the slack value setting device as one embodiment of the present invention.

FIG. 13 is a diagram showing an example another electronic circuit in which slack values are set up by the slack value setting device as one of the embodiment of the present invention. FIG. 14 is a diagram for illustrating the process when setting up the slack values in the electronic circuit shown in FIG. 13 using the slack value setting device as one embodiment of the present invention.

In the electronic circuit shown in FIG. 13, plural branching pins are provided on a data path connecting the feeding side FF (source) and the receiving side FF (Target) FF. In the example shown in FIG. 13, 10 branching pins are provided (refer to symbol [1]-[10]).

When setting up the slack values to the electronic circuit, which has 10 branching pins [1]-[10] as shown in FIG. 13, as shown in FIG. 14, in the order #1, setting (pass on) processing of the slack values is carried out on the another paths using the branching pin [1] and the branching pin [2] as the start points respectively. And then, in the order #2, setting (pass on) processing of the slack values is carried out on the another paths using the branching pin [3] and the branching pin [4] as the start points respectively. After that, in the order #3, setting (pass on) processing of the slack values is carried out on the another paths using the branching pin [5], the branching pin [6] and the branching pin [7] as the start points respectively. Further in the order #4, setting (pass on) processing of the slack values is carried out on the another paths using the branching pin [8] and the branching pin [9] as the start points respectively. And in the order #5, a slack value is set on the another path using the branching pin [10] as the start point.

In the electronic circuit also, which has a complicated branch paths as described above, by using the slack value setting technique of the present invention, the slack values can be set up to every transit pin on the data paths by ten slack pass-on processing.

Figure 15:
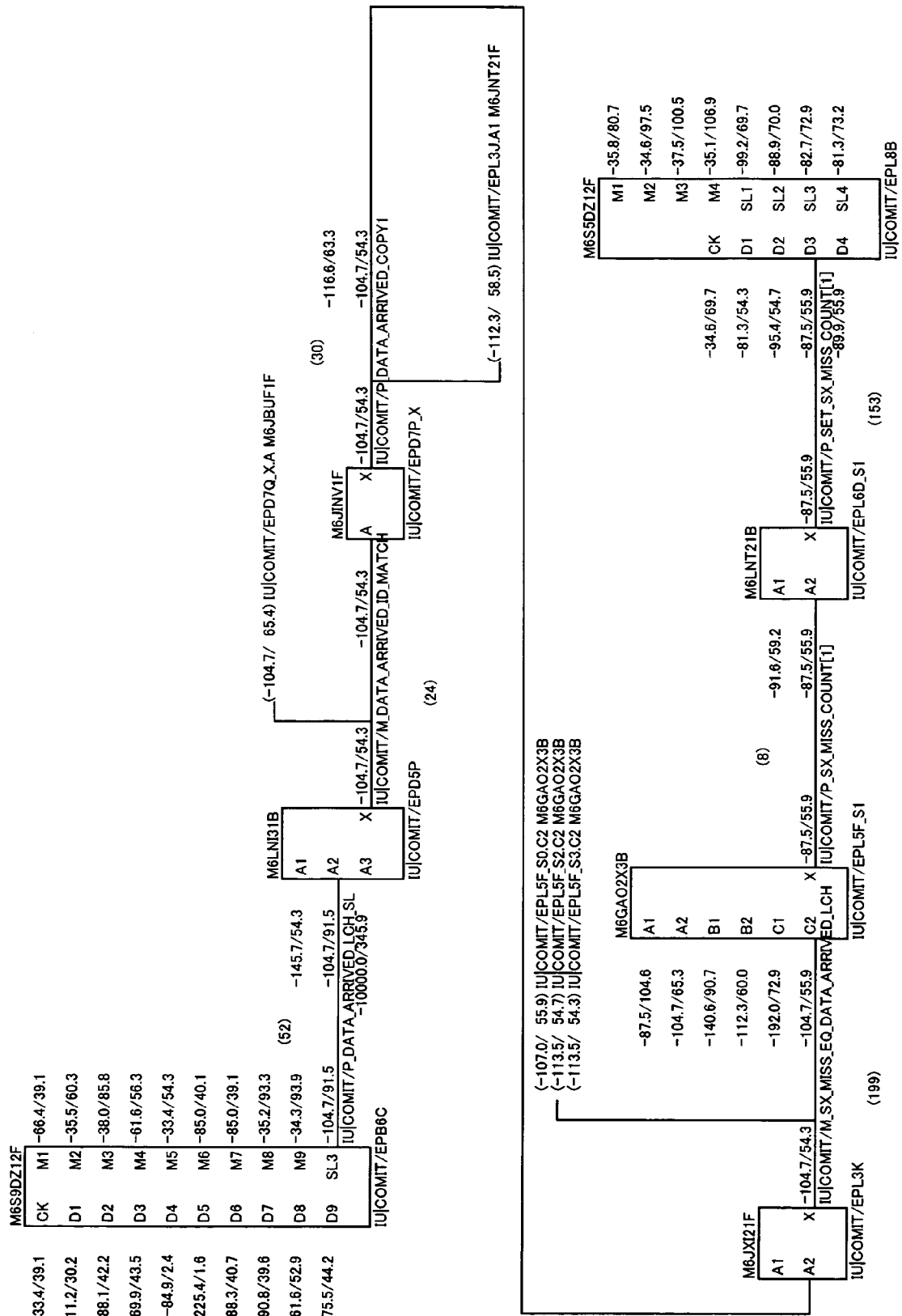
FIG. 15 is a diagram showing an example of a data path having slack value set up by using the slack value setting device as one embodiment of the present invention.
Figure 16:
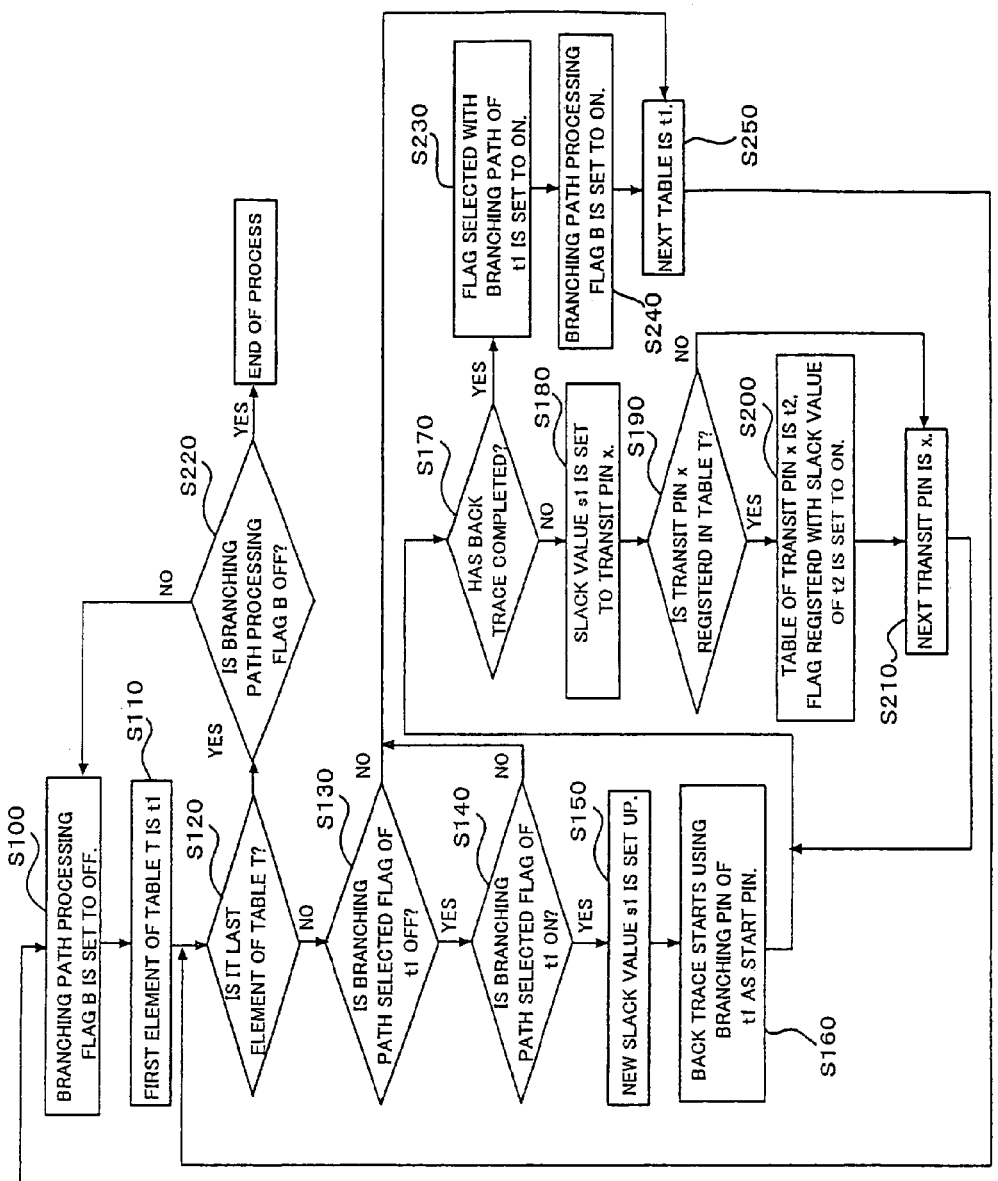
FIG. 16 is a flowchart for illustrating a conventional setting technique of slack value.

FIG. 15 is a diagram showing an example of data paths indicating the slack values set up using the slack value setting device 1 as one embodiment of the present invention, as well as a diagram showing an example of trace using the slack value with a maximum or minimum value. In FIG. 15, the slack values on every transit pin on macros are shown. When a net branch is included, the destination pins of the branch and the slack value are indicated. After setting up the slack values using the slack value setting device 1, by creating a block diagram as shown in FIG. 15, it is possible to visibly determine the margins in the branching pins.

As described above, according to the slack value setting device 1 as one embodiment of the present invention, the branching pins on the data paths are selected in a predetermined order; i.e., in a pick-out order of the backward trace on the data paths, which start from the worst path; and in this order, the slack values are set up while carrying out the backward trace on the data paths (another paths) using each of the branching pins as the start pin in order. Accordingly, the slack values can be set up to every transit pin on the data paths by minimum processing; thus the setting of the slack values can be carried out at a short time.

The program (slack value setting program) for achieving the above-described functions as the path recognizing section 11, the worst path selecting section 12, the slack value calculating section (first slack value calculating section, second slack value calculating section, third slack value calculating section) 13, the data path tracing section 14 and the slack value setting judgment section 21 is provided being recorded in a recording medium readable by a computer such as, for example, Flexible disk, CD(CD-ROM, CD-R, CD-RW etc.), DVD (DVD-ROM, DVD-RAM, DVD-R, DVD–RW, DVD+RW, etc.),magnetic disk, optical disk, magnetic optical disk. The computer reads out the program from the recording medium and transfers it to an internal or external storage to store and use the program. Further, it may be arranged so that the program is recorded in, for example, a storage (recording medium) such as a magnetic disk, an optical disk and magnetic optical disk, and the program is provided to the computer from the storage via a communication line.

To carry out the functions as the path recognizing section 11, the worst path selecting section 12, the slack value calculating section (first slack value calculating section, the second slack value calculating section, the third slack value calculating section) 13, the data path tracing path 14 and the slack value setting judgment section 21, the program stored in the internal storage (in this embodiment, RAM or ROM in the computer) is executed by a microprocessor (in this embodiment, CPU in the printer) of the computer. Here, it may be arranged so that the computer reads out and executes the program recorded in the recording medium.

In this embodiment, the wording computer is of a concept including hardware and an operating system; and it means the hardware, which operates under the control of an operating system. In the case where only the application program operates the hardware without using operating system, the hardware itself is the computer. The hardware comprises at least a microprocessor such as CPU and a device for reading out the computer program recorded in a recording medium. In this embodiment, the slack value setting device 1 has the function as the computer.

Further as for the recording medium in this embodiment, in addition to the above-described flexible disk, (CD-ROM, CD-R, CD-RW etc.), DVD (DVD-ROM, DVD-RAM, DVD-R, DVD–RW, DVD+RW, etc.), magnetic disk, optical disk and magnetic optical disk, various kinds of mediums readable by a computer such as IC card, ROM cartridge, magnetic tape, punch card, internal storage in the computer (memory such as RAM and ROM), external storage and a printing printed with symbols such as bar code are applicable.

When the function of the above-described slack value setting device 1 as one embodiment of the present invention is provided to, for example, a CAD (computer-aided design) system for carrying out circuit design, electronic circuit, which is designed by using the CAD system, can be readily evaluated. In this case, a computer system, which functions as the CAD system, can be made to function as the slack value setting device 1.

Irrespective of the above-described embodiment, the present invention can be carried out by variously modifying within a range of the sprit of the present invention. For example, in the above embodiment, the delay of the line connecting the gates is assumed as 0. However the present invention is not limited to the above. The delay of the line between the gates may be taken into consideration.

When the embodiments of the present invention are disclosed, the present invention can be carried out and manufactured by a person skilled in the art.

What is claimed is:

1. A slack value setting method setting a slack value to each of transit pins of plural gates on data paths with respect to an electronic circuit having plural data paths between a start point to an end point, the slack value setting method comprising:

selecting a worst path having a largest path delay in said plural data paths;

calculating a first slack value to be set up to each of the transit pins on the worst path;

setting up the calculated first slack value to each of the transit pins on said worst path;

generating a worst path branching pin table registered with branching pins in a predetermined order by carrying out a backward trace from an end point toward a start point of the worst path to select the branching pins in the backward trace of the worst path;

calculating a second slack value to be set up to each of the transit pins on another paths other than the worst path in said plural data paths; and setting up the second slack value to each of the transit pins on the another paths by carrying out a backward trace on the another paths from a respective branching pin stored in the generated worst path branching pin table.

2. The slack value setting method according to claim 1, further comprising determining whether said first slack value and said second slack value have been set up with respect to each of the transit pins on said data paths, wherein, said determining whether said first slack value and said second slack value, said calculating a second slack value and said setting up a second calculated slack value are repeatedly carried out until it is determined that said first slack value and said second slack value has been set up to all of the transit pins on the data paths.

3. The slack value setting method according to claim 2, further comprising:

generating an another path branching pin table registered with the branching pins in a predetermined order by carrying out a backward trace on the another paths from one of the branching pins to select the branching pins in the backward direction of the another paths;

calculating a third slack value to be set up to each of the transit pins on the another paths; and setting the third calculated slack value to each of the transit pins on the another paths by carrying out a backward trace on the another paths from said one of the branching pins stored in the another path branching pin table based on the generated another path branching pin table, wherein said generating an another path branching pin table, said calculating a third slack value and said setting a third slack value are repeatedly carried out until it is determined that the third slack value has been set up to all of the transit pins on the data paths.

4. A slack value setting method setting a slack value to each of transit pins of plural gates on data paths with respect to an electronic circuit having plural data paths between a start point to an end point, the slack value setting method comprising:

calculating the slack value to be set up to each of the transit pins on the data paths;

generating a branching pin table registered with branching pins in a predetermined order by carrying out a backward trace from the end point to the start point of one of said data paths to select branching pins in the backward direction of said one of said data paths;

setting the calculated slack value to said each of the transit pins on the data paths by carrying out backward trace on the data path from the branching pins stored in the branching pin table based on the generated branching pin table; and determining whether or not the slack value has been set up with respect to the branching pins on said data path, wherein said calculating the slack value, said generating a branching pin table and said setting the calculated slack value are repeatedly carried out until it is determined that the slack value has set up to all of the branching pins on the data paths.

5. A slack value setting device for setting a slack value to each of transit pins of plural gates on data paths with respect to an electronic circuit having plural data paths between a start point to an end point, the slack value setting device comprising:

a worst path selecting section selecting a worst path having the largest path delay in said plural data paths;

a first slack value calculating section calculating a first slack value to be set up to each of the transit pins on the worst path;

a first slack value setting section setting up the first slack value calculated in the first slack value calculating section to each of the transit pins on said worst path;

a worst path branching pin table generating section generating a worst path branching pin table registered with branching pins in a predetermined order by carrying out a backward trace from the end point toward the start point of the worst path to select the branching pins in the backward trace of the worst path;

a second slack value calculating section calculating a second slack value to be set up to each of the transit pins on another paths other than the worst path in said plural data paths; and a second slack value setting section setting up the second slack value calculated in the second slack value calculating section to each of the transit pins on the another paths by carrying out a backward trace on the another paths from one of the branching pins stored in the worst path branching pin table based on the generated worst path branching pin table.

6. The slack value setting device according to claim 5, further comprising:

a slack value setting determination section determining whether said second slack value has been set up with respect to the transit pins on said data paths, wherein the second slack value calculating section and the second slack value setting section repeatedly carry out the calculation of said second slack value and the setting of said second slack value respectively until it is determined that the first slack value and the second slack value has been set up to all of the transit pins on the data paths by the slack value setting determination section.

7. The slack value setting device according to claim 6, further comprising:

an another path branching pin table generating section generating an another path branching pin table registered with the branching pins in a predetermined order by carrying out backward trace on the another paths from a branching pin to pick out the branching pins in the backward direction of the another paths;

a third slack value calculating section calculating a third slack value to be set up to each of the transit pins on the another paths; and a third slack value setting section setting the third slack value calculated in the third slack value calculating section to each of the transit pins on the another paths by carrying out backward trace on the another paths from the branching pin stored in the another path branching pin table based on the generated another path branching pin table, wherein the another path branching pin table generating section, the third slack value calculating section and the third slack value setting section repeatedly carry out the generation of said another path branching pin table, the calculation of said third slack value and the setting of said third slack value until it is determined that the third slack value has been set up to all of the transit pins on the data paths by the slack value setting determination section.

8. A recording medium recording therein a slack value setting program readable by a computer, which causes the computer to execute a slack value setting function to set up slack values to transit pins of plural gates on a data path with respect to an electronic circuit having plural data paths between a start point and an end point, wherein the slack value setting program causes the computer to execute:

a worst path selecting section selecting a worst path having the largest path delay in said plural data paths;

a first slack value calculating section calculating a first slack value to be set up to each of the transit pins on the worst path;

a first slack value setting section setting up the first slack value calculated in the first slack value calculating section to each of the transit pins on said worst path;

a worst path branching pin table generating section generating a worst path branching pin table registered with the branching pins in a predetermined order by carrying out a backward trace from the end point toward the start point of the worst path to select the branching pins in the backward direction of the worst path;

a second slack value calculating section calculating a second slack value to be set up to each of the transit pins on another paths other than the worst path in said plural data paths; and a second slack value setting section setting up the second slack value calculated in the second slack value calculating section to each of the transit pins on the another paths by carrying out a backward trace on the another paths from the branching pins stored in the worst path branching pin table based on the worst path branching pin table generated in the worst path branching pin table generating section.

9. The recording medium recording therein a slack value setting program readable by a computer according to claim 8, wherein the slack value setting program causes the computer to execute a slack value setting determination section determining whether the fist slack value and the second slack value has been set up with respect to the transit pins on said data paths, and further causes the computer to repeatedly execute the second slack value calculation section and the second slack value setting section until it is determined that the slack value has been set up to all of the transit pins on the data paths in the slack value setting determination section.

10. The recording medium recording therein a slack value setting program readable by a computer according to claim 9, wherein the slack value setting program causes the computer to execute:

an another path branching pin table generating section generating an another path branching pin table registered with branching pins in a predetermined order by carrying out backward trace on the another paths from a branching pin to select the branching pins in the backward direction of the another paths;

a third slack value calculating section calculating a third slack value to be set up to each of the transit pins on the another paths; and a third slack value setting section setting the third slack value calculated in the third slack value calculating section to each of the transit pins on the another paths by carrying out a backward trace on the another paths from the branching pin stored in the another path branching pin table based on the another path branching pin table generated in the another path branching pin table generating section, and further causes the computer to execute the another path branching pin table generating section, the third slack value calculation section and the third slack value setting section repeatedly until it is determined that the slack value has been set up to all of the transit pins on the data paths in the slack value setting determination section.

\* \* \* \* \*